(12) United States Patent
Choi et al.

(10) Patent No.: US 9,629,244 B2
(45) Date of Patent: Apr. 18, 2017

(54) CONNECTOR ASSEMBLY AND LIQUID CRYSTAL DISPLAY APPARATUS HAVING THE SAME

(71) Applicant: Samsung Display Co., LTD., Yongin, Gyeonggi-Do (KR)

(72) Inventors: Song-Ho Choi, Cheonan-si (KR); Yun-Ho Jang, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 124 days.

(21) Appl. No.: 14/308,604

(22) Filed: Jun. 18, 2014

(65) Prior Publication Data

US 2015/0222053 A1  Aug. 6, 2015

(30) Foreign Application Priority Data

Feb. 6, 2014 (KR) .................. 10-2014-0013476

(51) Int. Cl.
| | |
|---|---|
| *G02F 1/1333* | (2006.01) |
| *H05K 1/14* | (2006.01) |
| *H01R 13/633* | (2006.01) |
| *H01R 13/639* | (2006.01) |
| *H01R 12/79* | (2011.01) |

(52) U.S. Cl.
CPC ............. *H05K 1/14* (2013.01); *G02F 1/1333* (2013.01); *H01R 13/639* (2013.01); *H01R 13/6335* (2013.01); *H01R 12/79* (2013.01); *H05K 1/147* (2013.01); *H05K 2201/10136* (2013.01); *H05K 2201/10189* (2013.01)

(58) Field of Classification Search
CPC ..................................................... G02F 1/1333
See application file for complete search history.

(56) References Cited

U.S. PATENT DOCUMENTS

| 8,096,823 B2 | 1/2012 | Tagawa et al. |
| 8,123,550 B2 | 2/2012 | Hoshino et al. |
| 2007/0019147 A1* | 1/2007 | Ryu ................ G02F 1/13452 349/152 |

(Continued)

FOREIGN PATENT DOCUMENTS

| JP | 4286279 | 6/2009 |
| JP | 2013-008548 | 1/2013 |

(Continued)

*Primary Examiner* — Paisley L Arendt
*Assistant Examiner* — Edmond Lau
(74) *Attorney, Agent, or Firm* — Innovation Counsel LLP

(57) ABSTRACT

A connector assembly includes a first connector and a second connector. The first connector includes a first main body, a guide member disposed on a side surface of the first main body, and a connecting member disposed on the first main body. The second connector is configured to be combined with the first connector. The second connector includes a second main body, a fixing member disposed on a side surface of the second main body and rotatably connected to each side surfaces at an end portion of the second main body, and a connecting pad disposed on the second main body to contact with the connecting member. Thus, the first connector and the second connector may combine and separate easily, so that a damage of the connector assembly may be prevented.

20 Claims, 4 Drawing Sheets

(56) References Cited

U.S. PATENT DOCUMENTS

| | | | |
|---|---|---|---|
| 2010/0261375 A1* | 10/2010 | Wang | H01R 12/88 439/492 |
| 2012/0196466 A1 | 8/2012 | Igarashi et al. | |
| 2013/0237098 A1 | 9/2013 | Inomae | |
| 2013/0260601 A1 | 10/2013 | Yamaji et al. | |

FOREIGN PATENT DOCUMENTS

| | | |
|---|---|---|
| JP | 2013-187056 | 9/2013 |
| KR | 10-2007-0120354 | 12/2007 |
| KR | 10-0916422 | 9/2009 |
| KR | 10-2011-0035387 | 4/2011 |

* cited by examiner

CONNECTOR ASSEMBLY AND LIQUID CRYSTAL DISPLAY APPARATUS HAVING THE SAME

This application claims priority to Korean Patent Application No. 10-2014-0013476, filed on Feb. 6, 2014, and all the benefits accruing therefrom under 35 U.S.C. §119, the content of which are incorporated by reference herein in its entirety.

BACKGROUND

1. Field

Exemplary embodiments relate to a connector assembly and a liquid crystal display apparatus having the same, and more particularly, to a connector assembly with easy combining and separating, and improved damage resistance and a liquid crystal display apparatus having the same.

2. Description of the Related Art

A liquid crystal display apparatus is one of a flat panel display FPD, which is used broadly recently. Examples of the flat panel display include, but are not limited to, a liquid crystal display ("LCD"), a plasma display panel ("PDP") and an organic light emitting display ("OLED").

A liquid crystal display apparatus is one of the most widely used types of flat panel displays. The liquid crystal display apparatus applies an electric field to specific molecules of liquid crystal in a liquid crystal cell to alter arrangements of the molecules and change optical characteristics of the liquid crystal cell such as birefringence, optical activity, dichroism and light scattering, for example, to display an image.

The liquid crystal display apparatus includes a liquid crystal display panel and a backlight assembly. The liquid crystal display apparatus generally includes data lines, gate lines and switching elements. A printed circuit board generating a driving signal and a liquid crystal display panel are connected to apply the driving signal to the data lines and the gate lines. The printed circuit board which has a driving integrated circuit (IC) on it and the liquid crystal display panel are connected by a connector. Thus, driving signals from the driving integrated circuit (IC) are transmitted to the liquid crystal display panel through the printed circuit board.

Generally, the connector includes a female connector and a male connector, and the female connector and the male connector are connected and disconnected manually.

However, when the female connector and the male connector are connected with each other, the connector may be damaged by an uneven pressure applied to the connector. When the female connector and the male connector are disconnected, an edge of the connectors may be bent by an uneven pressure and connecting terminals of the male connector may be disconnected.

SUMMARY

Exemplary embodiments provide a connector assembly with easy combining and separating, and improved damage resistance.

Exemplary embodiments also provide a liquid crystal display apparatus including the above-mentioned connector assembly.

In an exemplary embodiment, a connector assembly includes a first connector and a second connector. The first connector includes a first main body, a guide member disposed on each side surfaces of the first main body, and a connecting member disposed on the first main body. The second connector is configured to be configured to be combined with the first connector. The second connector includes a second main body, a fixing member disposed on a side surface of the second main body and rotatably connected to each side surfaces at an end portion of the second main body, and a connecting pad disposed on the second main body to contact with the connecting member.

In an exemplary embodiment, the fixing member may have a U-shape portion and two end portions of the U-shaped portion are rotatably connected to each side of the end portion of the second main body.

In an exemplary embodiment, the fixing member may surround a side surface of the first connector and the second connector.

In an exemplary embodiment, a bottom surface of the fixing member may face a top surface of the guide member and overlaps the guide member.

In an exemplary embodiment, the fixing member may further include a connection portion connecting the two end portions of the U-shaped portion.

In an exemplary embodiment, the fixing member may further include protrusions protruded from the two end portions and extending substantially perpendicular to the U-shaped portion toward the first connector.

In an exemplary embodiment, the fixing member may further include connection portion connecting the protrusions.

In an exemplary embodiment, the fixing member may further include protrusions protruded from the end portion of the second main body and extending substantially perpendicular to the second main body.

In an exemplary embodiment, the fixing member may further include connection portion connecting the protrusions.

In an exemplary embodiment, the fixing member may surround a side surface of the first connector and the second connector, and a bottom surface of the fixing member face a top surface of the guide member and overlaps the guide member.

In accordance with an exemplary embodiment, a liquid crystal display apparatus includes a liquid crystal display panel, a driving part, a first printed circuit board, a second printed circuit board and a connector. The liquid crystal display panel includes a first substrate and a second substrate facing the first substrate. The driving pan is disposed on a side surface of the liquid crystal display panel and the driving part is connected to the liquid crystal display panel. The first printed circuit board is connected to the driving part and transmits a signal to the driving part. The second printed circuit board is connected to the first printed circuit board and generates the signal to transmit the signal to the first printed circuit board. The connector assembly is combined the first printed circuit board and the second printed circuit board. The connector assembly includes a first connector and a second connector. The first connector includes a first main body, a guide member disposed on each side surfaces of the first main body, and a connecting member disposed on the first main body. The second connector is configured to be combined with the first connector. The second connector includes a second main body, a fixing member disposed on a side surface of the second main body and rotatably connected to each side surfaces at an end portion of the second main body and a connecting pad disposed on the second main body to contact with the connecting member.

In an exemplary embodiment, the fixing member may have a U-shape portion and two end portions of the U-shaped portion are rotatably connected to each side of the end portion of the second main body.

In an exemplary embodiment, the fixing member may surround a side surface of the first connector and the second connector.

In an exemplary embodiment, a bottom surface of the fixing member may face a top surface of the guide member and overlaps the guide member.

In an exemplary embodiment, the fixing member may further include a connection portion connecting the two end portions of the U-shaped portion.

In an exemplary embodiment, the fixing member may further include protrusions protruded from the two end portions and extending substantially perpendicular to the U-shaped portion toward the first connector.

In an exemplary embodiment, the fixing member may further include connection portion connecting the protrusions.

In an exemplary embodiment, the fixing member may further include protrusions protruded from the end portion of the second main body and extending substantially perpendicular to the second main body.

In an exemplary embodiment, the fixing member may further include connection portion connecting the protrusions.

In an exemplary embodiment, he fixing member may surround a side surface of the first connector and the second connector, and a bottom surface of the fixing member face a top surface of the guide member and overlaps the guide member.

In such embodiments, a pair of connectors are easily combined and separated, so that a damage of a connector assembly may be prevented.

BRIEF DESCRIPTION OF THE DRAWINGS

The above and other features of the inventive concept will become more apparent by describing in detailed exemplary embodiments thereof with reference to the accompanying drawings, in which.

DETAILED DESCRIPTION

Hereinafter, exemplary embodiments of the inventive concept will be described in detail with reference to the accompanying drawings.

Figure 1:
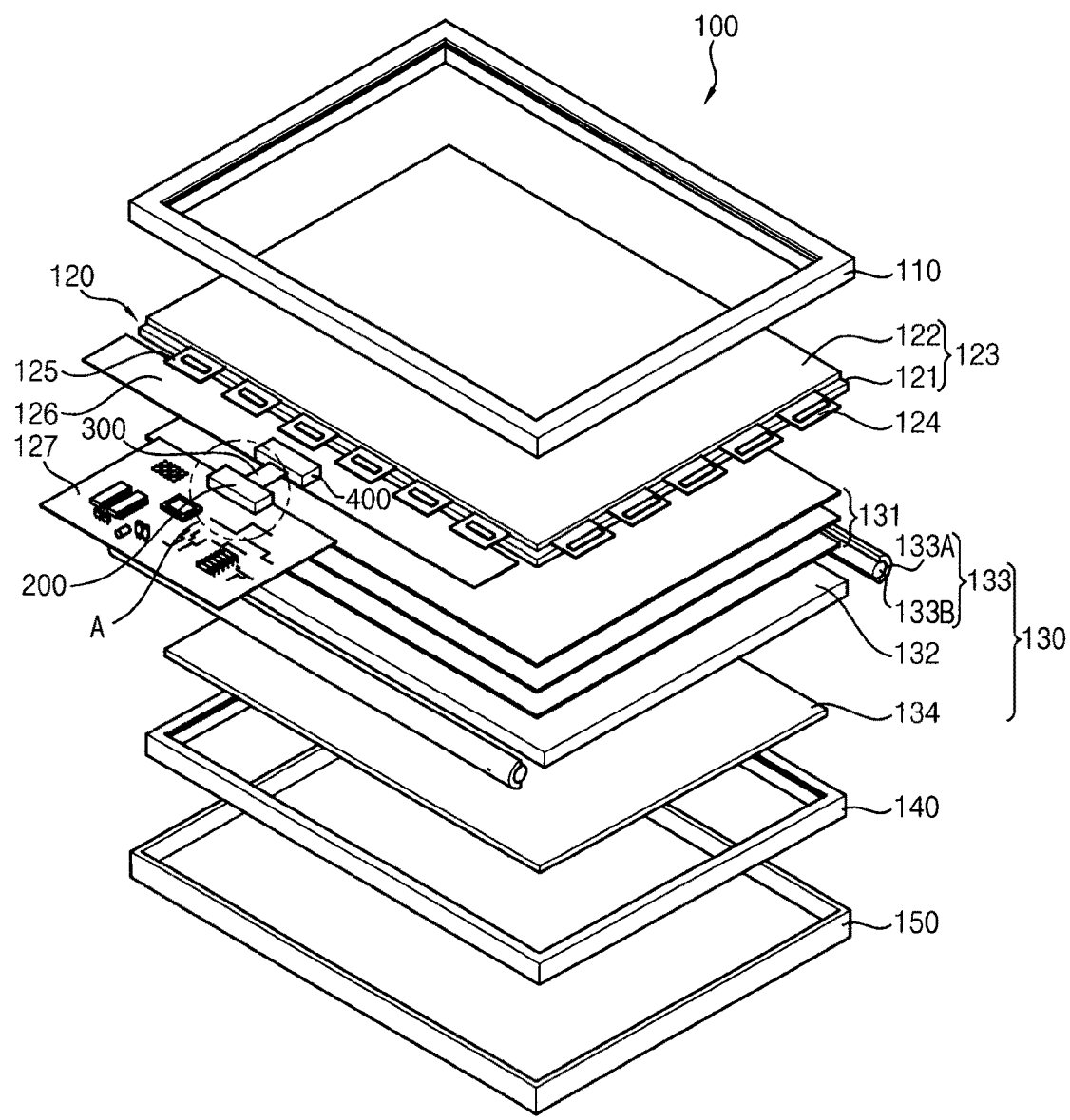
FIG. 1 is an exploded perspective view illustrating an exemplary embodiment according to the inventive concept of a liquid crystal display apparatus.
Figure 2:
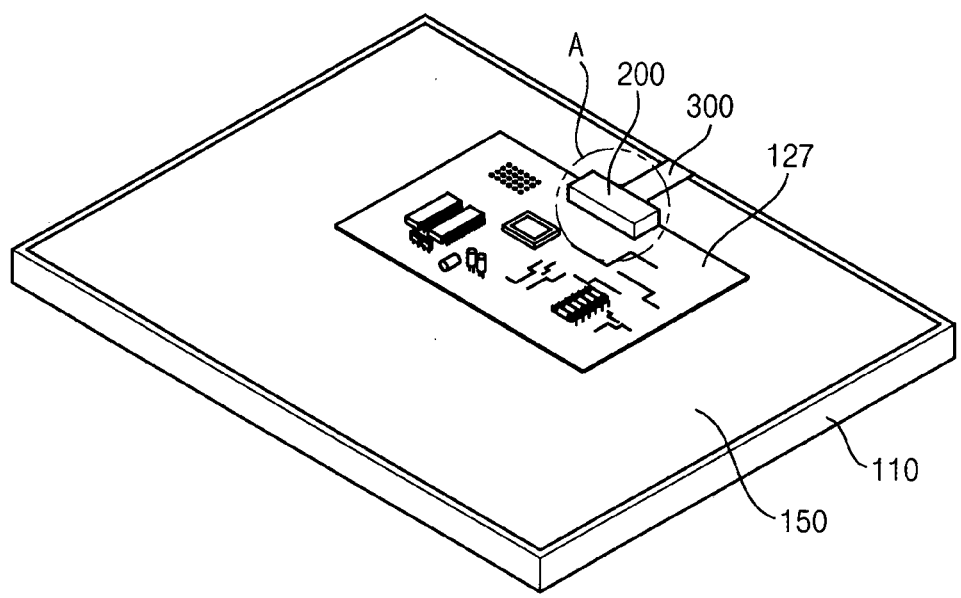
FIG. 2 is a rear view of the liquid crystal display apparatus shown in FIG. 1.

FIG. 1 is an exploded perspective view illustrating an exemplary embodiment according to the inventive concept of a liquid crystal display apparatus. FIG. 2 is a rear view of the liquid crystal display apparatus shown in FIG. 1.

Referring to FIGS. 1 and 2, an exemplary embodiment of a liquid crystal display apparatus 100 includes an upper container 110, a liquid crystal display panel 120, a backlight assembly 130, a mold frame 140 and a lower container 150.

The liquid crystal display panel 120 includes a panel part including a first substrate 121, a second substrate 122, a liquid crystal layer (not shown), a driving part 124 and 125, a first printed circuit board 126 and a second printed circuit board 127.

The first substrate 121 may be a transparent insulation substrate. For example, the transparent insulation substrate may be a glass substrate or a plastic substrate, but not being limited thereto. A plurality of pixel areas for displaying an image may be included in the first substrate 121. The plurality of the pixel areas may be disposed substantially in a matrix form having a plurality of rows and a plurality of columns.

A plurality of gate lines, a plurality of data lines and a plurality of pixels may be disposed on the first substrate 121. In an exemplary embodiment, the gate lines may extend in a first direction, and the data lines may extend in a second direction, which is substantially perpendicular to the first direction. Alternatively, the gate lines may extend in the second direction, and the data lines may extend in the first direction. Each pixel may be disposed on an area defined by the gate line and the data line.

Each pixel may further include a switching element. In one exemplary embodiment, for example, the switching element may be a thin film transistor. The switching element may be connected to the corresponding gate line and the corresponding data line adjacent thereto. The switching element may be disposed at a crossing area of the gate line and the data line.

The second substrate 122 may face the first substrate 121. The second substrate 122 may be a transparent insulation substrate. For example, the transparent insulation substrate may be a glass substrate or a plastic substrate, but not being limited thereto.

A color filter and a black matrix may be disposed on the second substrate 122. In an alternative exemplary embodiment, the color filter and/or a black matrix may be formed on the first substrate 121 to form a color filter-on-array ("COA") structure or a black matrix-on-array ("BOA") structure.

The liquid crystal layer may be disposed between the first substrate 121 and the second substrate 122.

The driving part 124 and 125 may be disposed on a side surface of the panel part 123. The driving part 124 and 125 may include a gate driving part 124 and a data driving part 125. The gate driving part 124 may be connected to the gate line of the first substrate 121 to provide a gate signal. The data driving part 125 may be connected to the data line of the first substrate 121 to provide a data signal.

The first printed circuit board 126 may be disposed on a side surface of the panel part 123. The first printed circuit board 126 may be connected to the panel part 123 through the driving part 124 and 125.

The second printed circuit board 127 may be adjacent to the first printed circuit board 126. The second printed circuit board 127 may be electrically connected to the first printed circuit board 126 through a flexible printed circuit film 300.

The second printed circuit board 127 may include a plurality of electronic elements to generate a signal for driving and controlling the panel part 123. Thus, the signal generated by the second printed circuit board 127 may be provided to the first printed circuit board 126 through the flexible printed circuit film 300. The signal provided to the first printed circuit board 126 may be provided to the panel part 123 through the data driving part 125, which is connected to the first printed circuit board 126.

The first printed circuit board 126 and the second printed circuit board 127 may be connected to a container to ground the first printed circuit board 126 and the second printed circuit board 127 thereby preventing a malfunction by an electro magnetic interference (EMI). The driving part 125 connected to the second printed circuit board 127 may be bent along a side surface of the lower container 150, thus, the first printed circuit board 126 may be disposed on a side surface of the lower container 150, and the second printed circuit board 127 may be disposed on a rear surface of the lower container 150.

The flexible printed circuit film 300 may electrically connect the first printed circuit board 126 with the second printed circuit board 127. The flexible printed circuit film 300 may include a base film and a conductive pattern. The base film may include polyimide. The conductive pattern may include a plurality of signal lines to form a circuit, thereby transmitting an electric signal.

The flexible printed circuit film 300 may be connected to the first printed circuit board 126 and the second printed circuit board 127 through a connector assembly 200 and 400 or an anisotropic conductive film (ACF) or the like.

The connector assembly may include a first connector assembly 200 and a second connector assembly 400.

For example, the flexible printed circuit film 300 and the first printed circuit board 126 may be connected through the second connector assembly 400. For example, the flexible printed circuit film 300 and the second printed circuit board 127 may be connected through the first connector assembly 200.

Alternatively, for example, the flexible printed circuit film 300 and the first printed circuit board 126 may be connected through the anisotropic conductive film. For example, the flexible printed circuit board 300 and the second printed circuit board 127 may be connected through the anisotropic conductive film.

The connector assembly 400 and 200 may be disposed on the first printed circuit board 126 and the second printed circuit board 127, respectively. A connecting pad of the flexible printed circuit film 300 may be inserted into the connector assembly 200 and 400. The connector assemblies 200 and 400 may be connected each other through the flexible printed circuit film 300.

The signal generated from the second printed circuit board 127 may be provided to the first printed circuit board 126 through the flexible printed circuit film 300.

The connector assembly 200 and 400 will be described in detail with reference to FIGS. 3 to 5B.

The backlight assembly 130 may be disposed on a lower surface of the liquid crystal display panel 120. The backlight assembly 130 may provide light to the liquid crystal display panel 120.

The backlight assembly 130 may include optical sheets 131, a light guide plate 132, a light source unit 133 and a reflective sheet 134.

The optical sheets 131 may be disposed on an upper surface of the light guide plate 132. The optical sheets 131 may transmit light toward an upper surface of the backlight assembly 130. For example, the optical sheets 131 may include at least one selected from the group consisting of a diffusion sheet, a prism sheet, a protect sheet and the like. The optical sheets 131 may be formed in a transparent resin, such as acryl resin, polyurethane resin, silicon resin, and the like.

The light guide plate 132 may have a rectangular-shape. The light guide plate 132 may guide light from the light source unit 133 to the upper surface of the backlight assembly 130 to the panel part 123. The light guide plate 132 may include a material having an excellent refractive index and transmissivity, such as polymethylmethacrylate (PMMA), polycarbonate (PC), polyethylene (PE) and the like.

The light source unit 133 may be disposed on a side surface of the light guide plate 132. The light source unit 133 may include a light source cover 133A and a light source 133B. For example, the light source 133B may be a linear light source, such as cold cathode fluorescent lamp (CCFL), hot cathode fluorescent lamp (HCFL) and the like, or a point light source, such as light emitting diode (LED) and the like.

The reflective sheet 134 may be disposed on a lower surface of the light guide plate 132. The reflective sheet 134 may reflect light to the upper surface of the light guide plate 132, thereby increasing efficiency and uniformity of the backlight to the upper surface of the light guide plate 132. The reflective sheet 134 may be a thin-film having an excellent elasticity and reflectivity. For example, the reflective sheets 134 may include a base film including polyethylene terephthalate (PET) and a metal film disposed thereon.

The mold frame 140 may include a receiving space therein. The mold frame 140 may receive the backlight assembly 130.

The mold frame 140 may have a rectangular-shape. The mold frame 140 may include an insulation resin.

The lower container 150 may be disposed on a lower surface of the backlight assembly 130. The lower container 150 may receive and support the liquid crystal display panel 120, the backlight assembly 130 and the mold frame 140.

The lower container 150 may be formed of aluminum or aluminum alloy. Furthermore, the first printed circuit board 126 may be disposed on a side surface of the lower container 150, and the second printed circuit board 127 may be disposed on a rear surface of the lower container 150.

The upper container 110 may be combined with the lower container 150. The upper container 110 may cover the liquid crystal display panel 120 and the backlight assembly 130 therein. The upper container 110 and the lower container 150 may be combined by hook.

Figure 3:
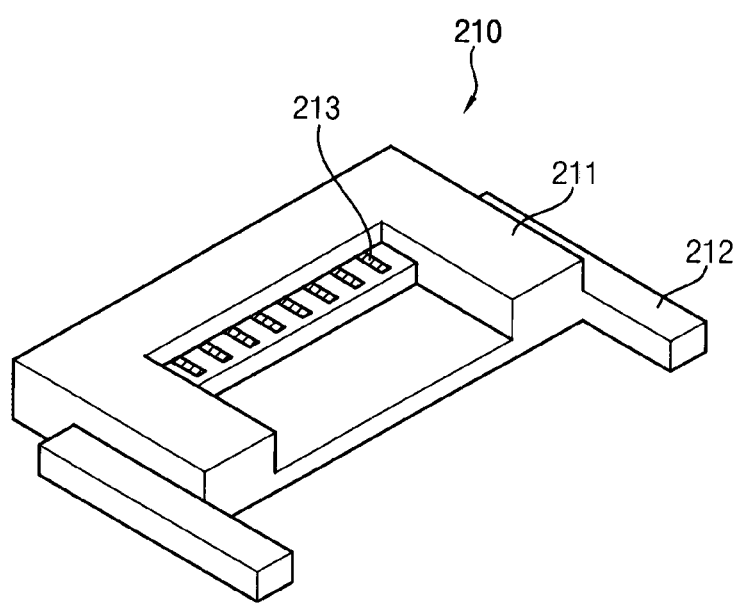
FIG. 3 is a perspective view illustrating an exemplary embodiment of a first connector.
Figure 4:
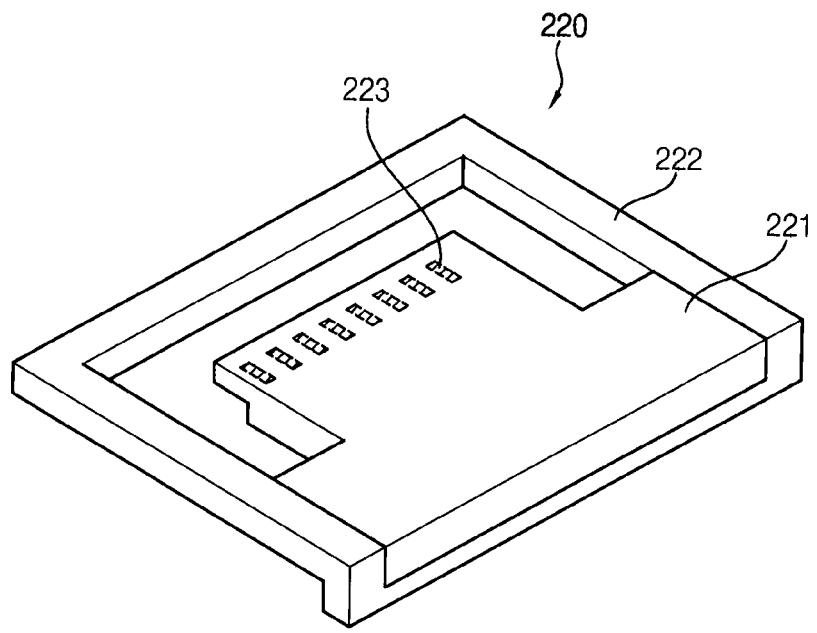
FIG. 4 is a perspective view illustrating an exemplary embodiment of a second connector.
Figure 5A:
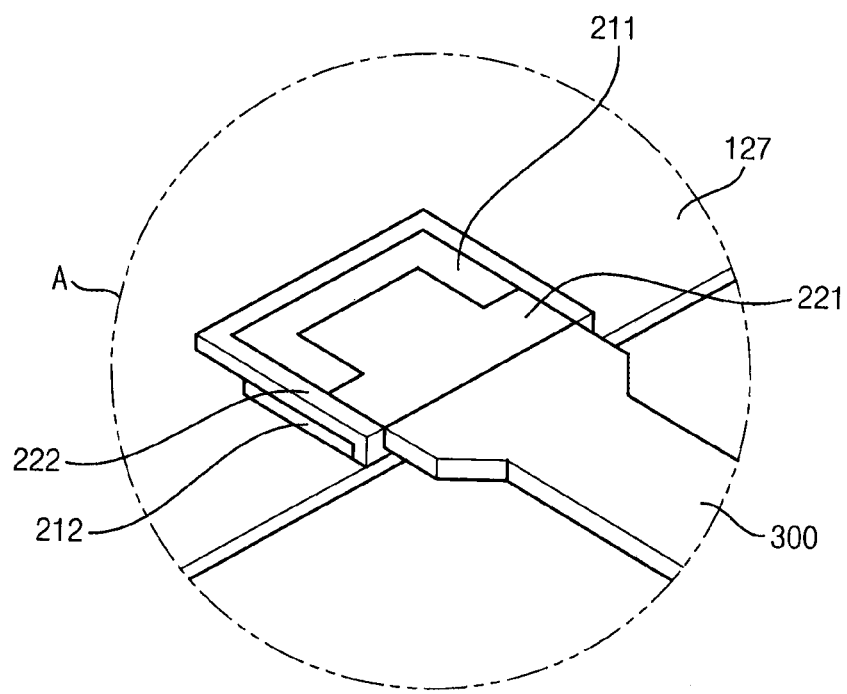
FIGS. 5A and 5B are enlarged-perspective views illustrating combination of a first connector and a second connector.
Figure 5B:
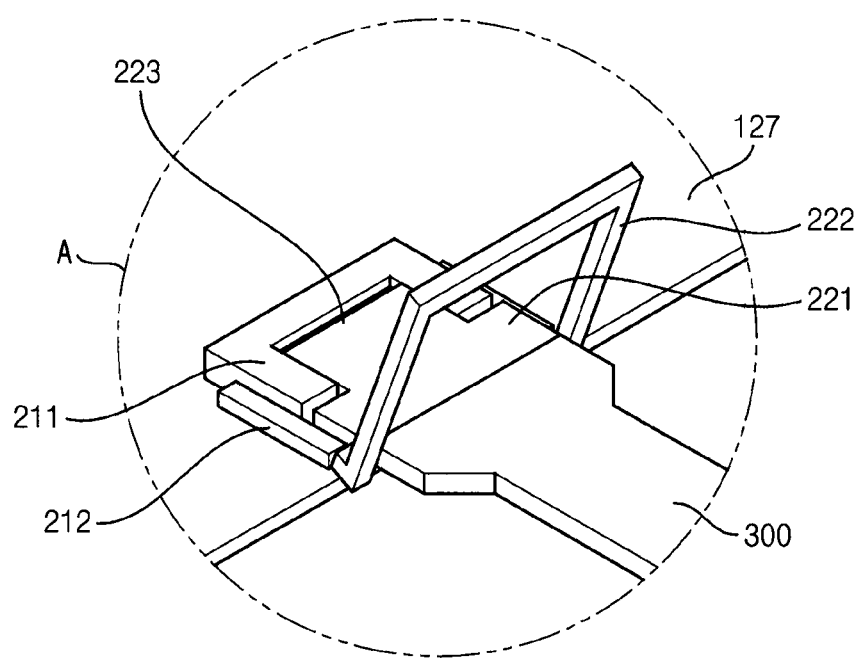

FIG. 3 is a perspective view illustrating an exemplary embodiment of a first connector. FIG. 4 is a perspective view illustrating an exemplary embodiment of a second connector. FIGS. 5A and 5B are enlarged-perspective views illustrating combination of a first connector and a second connector.

Referring to FIGS. 1 to 5B, the first connector assembly 200 includes a first connector 210 and a second connector 220.

In an exemplary embodiment, only the first connector assembly 200 will be described, because the second connector assembly 400 is substantially the same as the first connector assembly 200.

The first connector 210 includes a first main body 211, a guide member 212 and a plurality of connecting members 213.

The guide member 212 may be disposed on each side surface of the first main body 211. Thus, when the first connector 210 is combined with the second connector 220, the guide member 212 may guide the second connector 220 to an appropriate position, thereby makes it easy to combine the first connector 210 and the second connector 220.

The guide member 212 may be connected to a side surface of the first main body 211. Alternatively, a guide member may be formed of a same material and be formed in one piece with the first main body 211.

The connecting members 213 may be disposed on the first main body 211. Adjacent connecting members 213 may be spaced apart from each other by a first distance.

The second connector 220 may be combined with the first connector 210.

The second connector 220 includes a second main body 221, a fixing member 222 and a plurality of connecting pads 223.

The fixing member 222 may be rotatably connected to each side surface of the second main body 221. The fixing member 222 is rotatably connected to the one end portion of the second main body 221 which oppose to the other end of the main body in which the plurality of connecting pads 223 are disposed.

The fixing member 222 may be combined with the first connector 210 and the second connector 220, thereby fixing the first connector 210 and the second connector 220. For example, the fixing member 222 may surround side surfaces of the first main body 211 and the second main body 221.

The fixing member 222 may have a U-shape portion. The U-shaped portion is formed in a first plane and two end portions of a U-shaped portion are rotatably connected to the one end portion of the main body. Thus, the user may use the fixing member 222 as a handle for connecting the second connector 220 to the first connector 210.

The U-shaped fixing member may have protrusions protruded from two end portions of the U-shaped portion and extends substantially perpendicular to the U-shaped portion toward the first connector 210. The edges of the fixing member 222 may face and overlap a surface of the guide member 212. Thus, when the first connector 210 and the second connector 220 is connected, the edges of the fixing member 222 may contact the surface of the guide member 212, thereby fixing the first connector 210 and the second connector 220.

The fixing member 222 may be rotatably combined with a side surface of the second main body close to the one end of the second main body. When the fixing member 222 is pulled to a direction away from the first main body 211, the bent portion of the fixing member 222 may push the side surface of the guide member 212, thus, the first connector 210 and the second connector 220 may be easily disconnected due to an uniform power applied to the side surface of the guide member. End portions of the fixing member 222 in the one end of the fixing member may face lateral surface of the guide members 212. The first connector 210 may be easily separated from the second connector 220 by rotating the fixing member away from the first main body 211.

The connecting pads 223 may be disposed on the second main body 221 to contact with the connecting members 213.

Adjacent connecting pads 223 may be spaced apart from each other by a second distance, and the first distance and the second distance may be the same. Thus, the connecting members 213 and the connecting pads 223 may contact with each other.

The second connector 220 may further include the flexible printed circuit film 300 connected thereto.

For example, the first connector 210 may be a female connector, and the second connector 220 may be a male connector. Thus, the second connector may be inserted into the first connector 220.

In an exemplary embodiment of the inventive concept, the connector assembly connects printed circuit boards to transmit a driving signal, but is not limited thereto.

In an exemplary embodiment, a liquid crystal display apparatus is described as an exemplary embodiment, however, the connector may be used for any electrical device which needs a connector to transmit an electrical signal to the device.

Although a few exemplary embodiments of the inventive concept have been described, it is understood that the inventive concept should not be limited to these exemplary embodiments and various changes and modifications can be made by one of those ordinary skilled in the art within the spirit and scope of the inventive concept as hereinafter claimed.

What is claimed is:

1. A connector assembly comprising:
    a first connector comprising a first main body, a guide member disposed on each side surfaces of the first main body, and a connecting member disposed on the first main body; and
    a second connector configured to be combined with the first connector, the second connector comprising a second main body having a top surface, a bottom surface opposing the top surface, a first side surface, a second side surface opposing the first side surface, a first connecting surface connecting the first side surface and the second side surface, and a second connecting surface connecting the first side surface and the second side surface, a fixing member disposed on the first side surface and the second side surface of the second main body and rotatably connected to ends of the first side surface and the second side surface, and a connecting pad disposed on the second main body to contact with the connecting member,
    wherein the second main body and the fixing member form a hole corresponding to a shape of the first main body.

2. The connector assembly of claim 1, wherein the fixing member has a U-shape portion and two end portions of the U-shaped portion are rotatably connected to the one ends of the first side surfaces and the second side surface.

3. The connector assembly of claim 2, wherein the fixing member further comprises a connection portion connecting the two end portions of the U-shaped portion.

4. The connector assembly of claim 2, wherein the fixing member further comprises protrusions protruded from the two end portions and extending substantially perpendicular to the U-shaped portion toward the first connector.

5. The connector assembly of claim 4, wherein the fixing member further comprises a connection portion connecting the protrusions.

6. The connector assembly of claim 5, wherein the fixing member surrounds a side surface of the first connector and the second connector.

7. The connector assembly of claim 6,
    wherein the guide member includes a top surface, a bottom surface, a first side surface connected to the first main body, a second side surface opposing the first side surface, a first connecting surface connecting the first side surface and the second side surface and a second connecting surface connecting the first side surface and the second side surface and opposing the first connecting surface, the first side surface being close to the connecting member than the second connecting surface, and
    wherein the protrusions of the fixing member face the second connecting surface of the guide member.

8. The connector assembly of claim 1, wherein the fixing member further comprises protrusions protruded from end portions of the fixing member and extending substantially perpendicular to the second main body.

9. The connector assembly of claim 8, wherein the fixing member further comprises a connection portion connecting end portions of the protrusions.

10. The connector assembly of claim 9, wherein the fixing member surrounds a side surface of the first connector and the second connector, and a bottom surface of the fixing member faces a top surface of the guide member and overlaps the guide member.

11. A liquid crystal display apparatus comprising:
a liquid crystal display panel comprising a first substrate and a second substrate facing the first substrate;
a driving part disposed on a side surface of the liquid crystal display panel and connected to the liquid crystal display panel;
a first printed circuit board connected to the driving part and transmitting a signal to the driving part;
a second printed circuit board connected to the first printed circuit board and generating the signal to transmit the signal to the first printed circuit board; and
a connector assembly combining the first printed circuit board and the second printed circuit board and the connector assembly comprising:
a first connector comprising a first main body, a guide member disposed on each side surfaces of the first main body, and a connecting member disposed on the first main body; and
a second connector configured to be combined with the first connector, the second connector comprising a second main body having a top surface, a bottom surface opposing the top surface, a first side surface, a second side surface opposing the first side surface, a first connecting surface connecting the first side surface and the second side surface, and a second connecting surface connecting the first side surface and the second side surface, a fixing member disposed on the first side surface and the second side surface of the second main body and rotatably connected to one ends of the first side surface and the second side surface, and a connecting pad disposed on the second main body to contact with the connecting member,
wherein the second main body and the fixing member form a hole corresponding to a shape of the first main body.

12. The liquid crystal display apparatus of claim 11, wherein the fixing member has a U-shape portion and two end portions of the U-shaped portion are rotatably connected to the one ends of the first side surfaces and the second side surface.

13. The liquid crystal display apparatus of claim 12, wherein the fixing member further comprises a connection portion connecting the two end portions of the U-shaped portion.

14. The liquid crystal display apparatus of claim 12, wherein the fixing member further comprises protrusions protruded from the two end portions and extending substantially perpendicular to the U-shaped portion toward the first connector.

15. The liquid crystal display apparatus of claim 14, wherein the fixing member further comprises a connection portion connecting the protrusions.

16. The liquid crystal display apparatus of claim 15, wherein the fixing member surrounds a side surface of the first connector and the second connector.

17. The liquid crystal display apparatus of claim 16, wherein a bottom surface of the fixing member faces a top surface of the guide member and overlaps the guide member.

18. The liquid crystal display apparatus of claim 11, wherein the fixing member further comprises protrusions protruded from end portions of the fixing member and extending substantially perpendicular to the second main body.

19. The liquid crystal display apparatus of claim 18, wherein the fixing member further comprises a connection portion connecting end portions of the protrusions.

20. The liquid crystal display apparatus of claim 19, wherein the fixing member surrounds a side surface of the first connector and the second connector, and a bottom surface of the fixing member faces a top surface of the guide member and overlaps the guide member.

* * * * *